United States Patent [19]

Larson

[11] Patent Number: 4,709,207

[45] Date of Patent: Nov. 24, 1987

[54] LOADING SYSTEM

[75] Inventor: James R. Larson, Anoka, Minn.

[73] Assignee: Holaday Circuits, Inc., Minnetonka, Minn.

[21] Appl. No.: 763,570

[22] Filed: Aug. 8, 1985

[51] Int. Cl.$^4$ ............................................. G01R 31/02
[52] U.S. Cl. ............................. 324/158 F; 324/73 PC
[58] Field of Search ........... 324/158 F, 73 PC, 158 P, 324/158 R, 72.5; 29/842

[56] References Cited

FOREIGN PATENT DOCUMENTS 3340184 5/1985 Fed. Rep. of Germany ... 324/158 F

Primary Examiner—Ernest F. Karlsen
Attorney, Agent, or Firm—Hugh D. Jaeger

[57] ABSTRACT

Loading system for loading of test pins into printed circuit board test fixtures. Test pins are loaded into a loader body, and locked thereto by a sliding locking plate through frictional engagement at an interface where in test pin hole is of a reduced surface area. Upon alignment of the loading body to the sliding lock plate, increasing surface area of each test pin hole, the test pins drop through the loading body into the test fixture. The lower surface area of the head of the test pin controls movement of the test pin between the loading body and the test fixture through gravity free fall. After circuit board testings, the test pins are reloaded back to the original location within the loader body for subsequent new circuit loading and testing.

7 Claims, 7 Drawing Figures

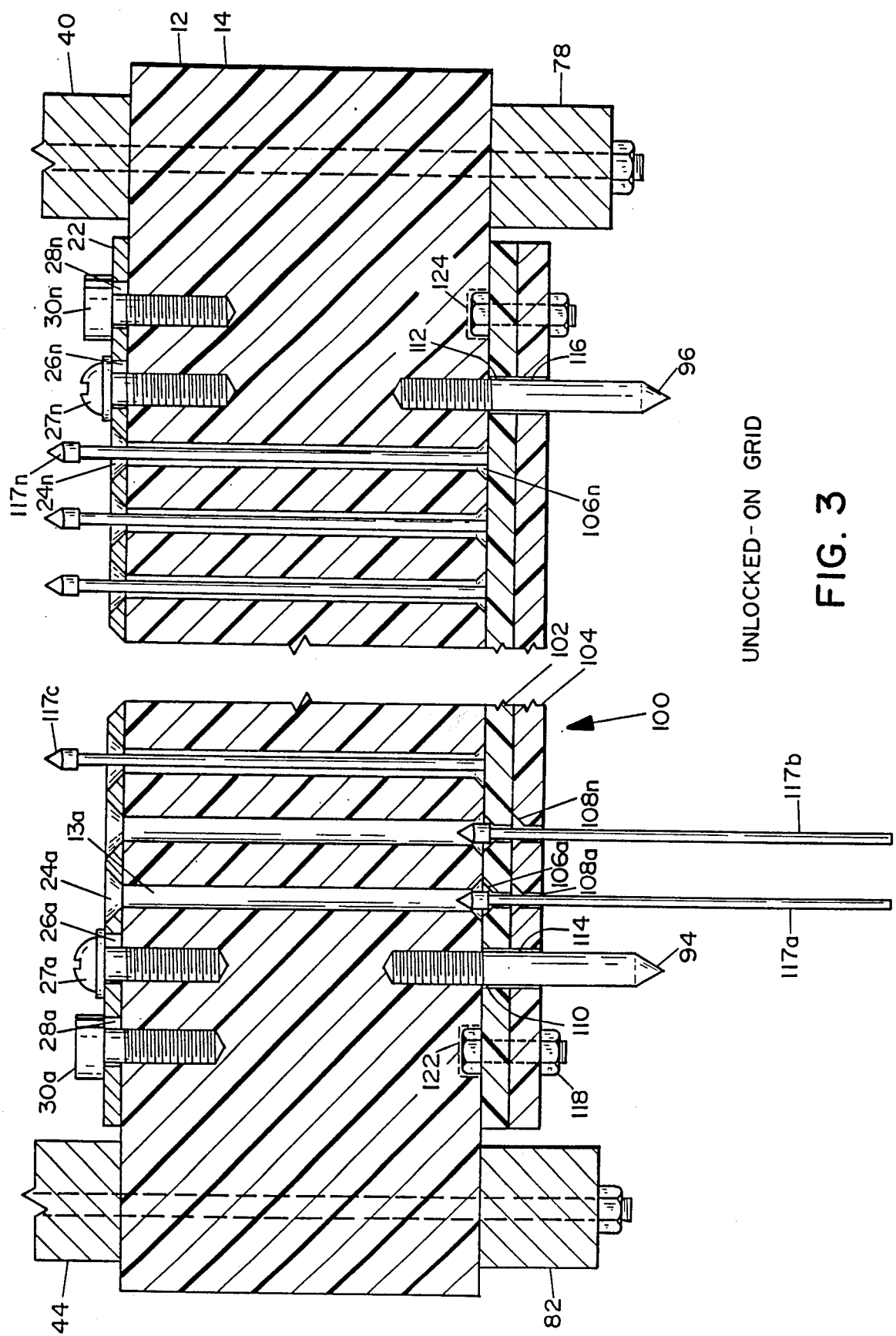
FIG. 3 UNLOCKED-ON GRID

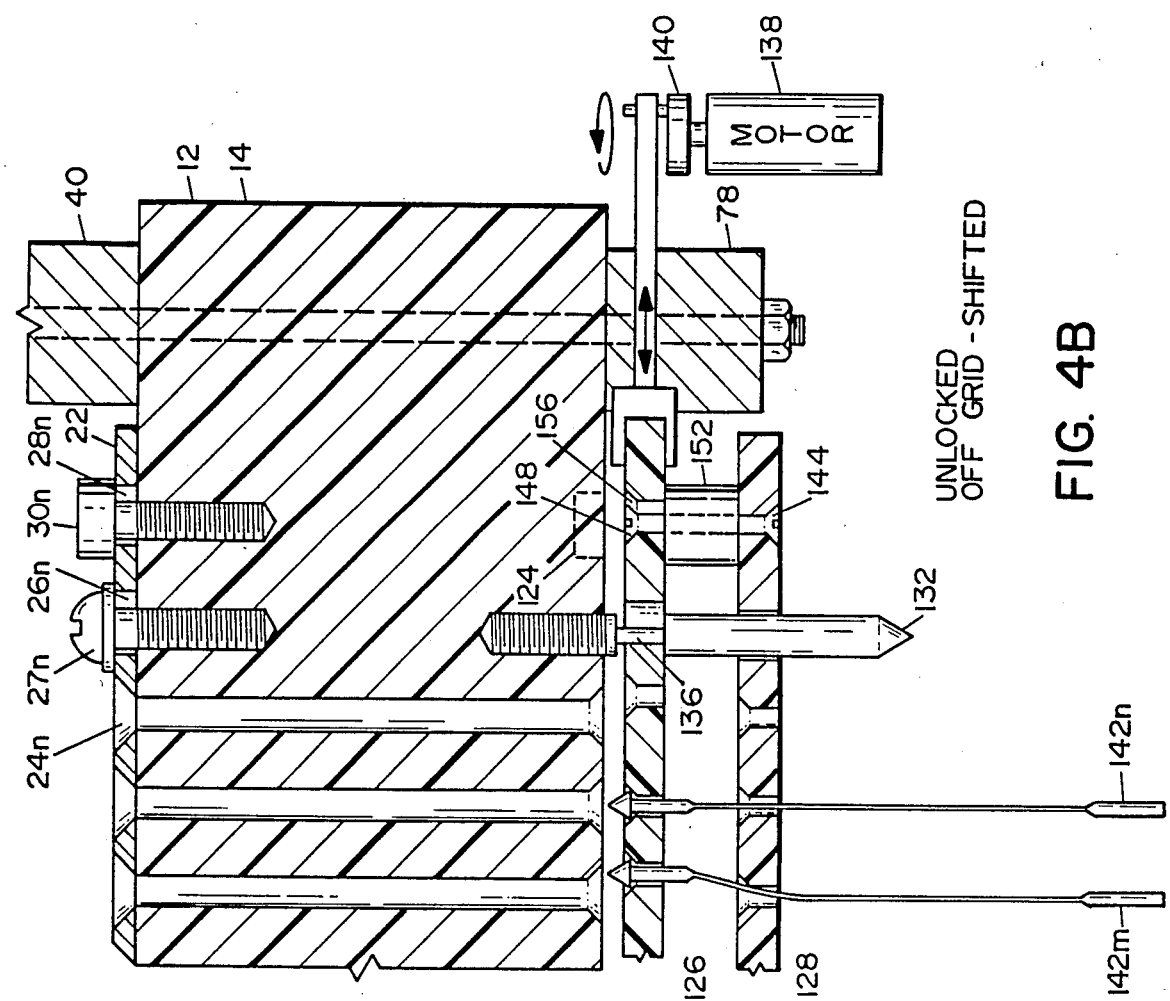
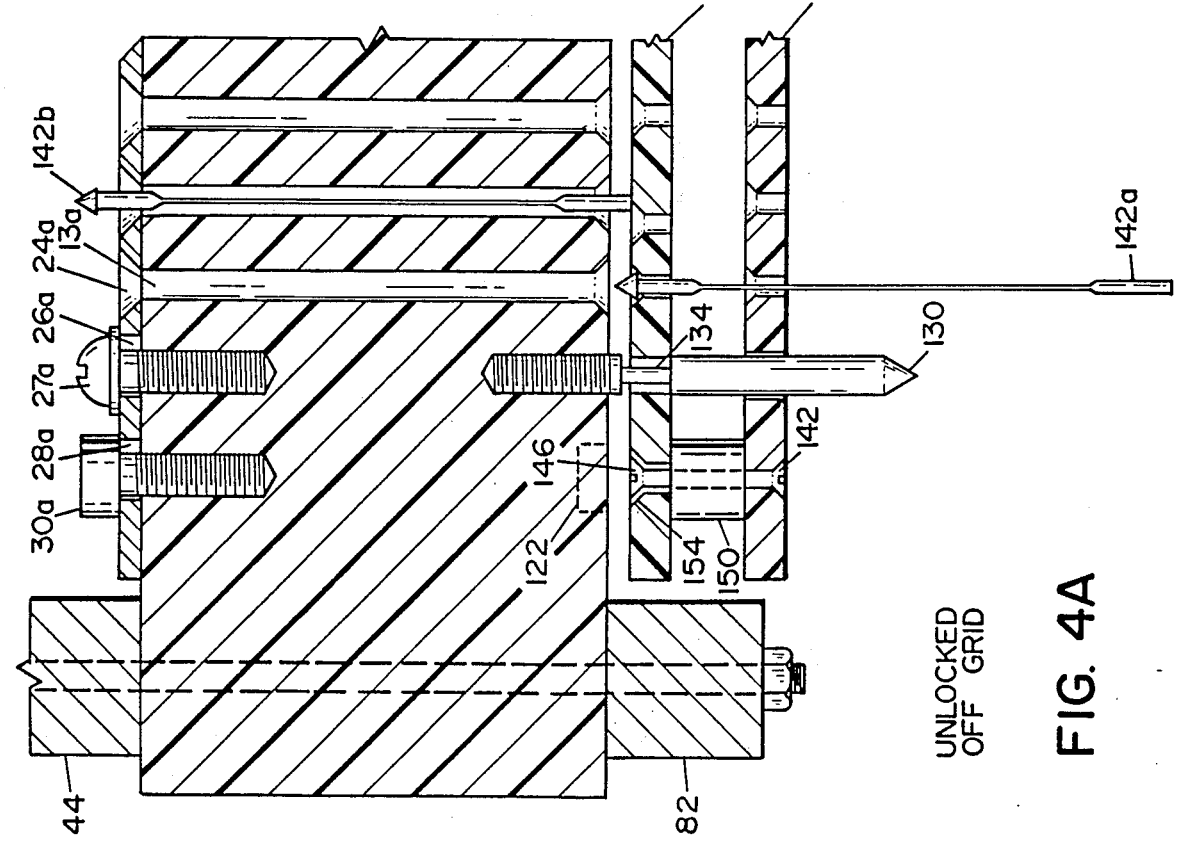
FIG. 4B UNLOCKED OFF GRID - SHIFTED
FIG. 4A UNLOCKED OFF GRID

LOADING

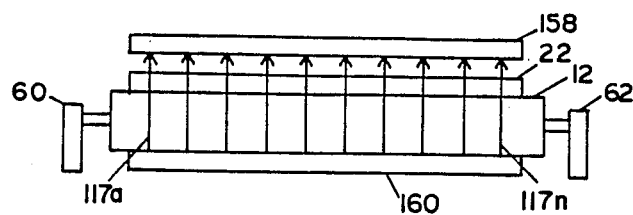

STEP 1
LOADER BODY 12 FULL OF TEST PINS 117a-117n WITH PROTECT PLATES 158 AND 160 ON TOP AND BOTTOM WITH LOCK PLATE 22 IN LOCK POSITION.

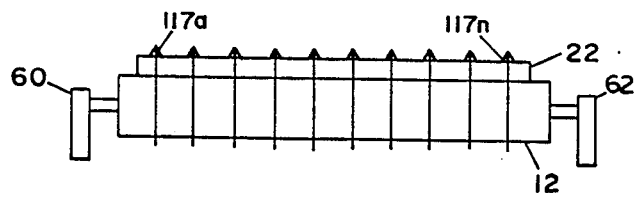

STEP 2
REMOVE TOP AND BOTTOM PROTECT PLATES 158 AND 160.

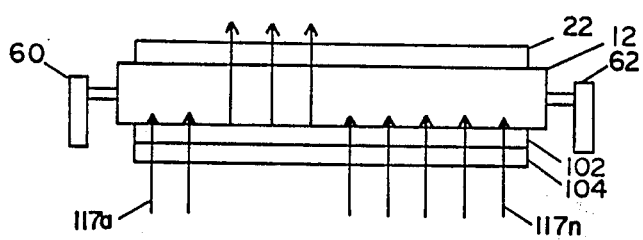

STEP 3
UNLOCK LOCK PLATE 22. PINS 117 FALL SELECTIVELY INTO UPPER AND PCB PATTERN 102 AND 104 PLATE HOLES.

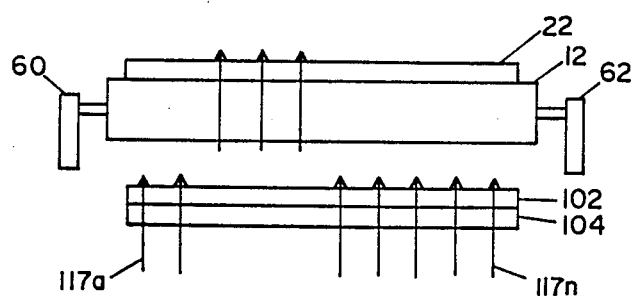

STEP 4
LOCK THE LOCK PLATE 22. REMOVE THE NOW LOADED UPPER AND LOWER PCB PATTERNS 102 AND 104.

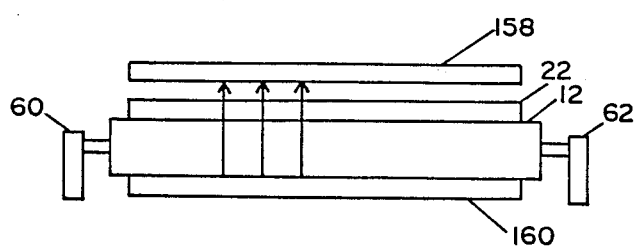

STEP 5
SECURE TOP AND BOTTOM PROTECT PLATES 158 AND 160 WITH CLAMPS (NOT SHOWN). THE UNIT IS NOW READY FOR STORAGE OR SHIPPING.

FIG. 5

UNLOADING

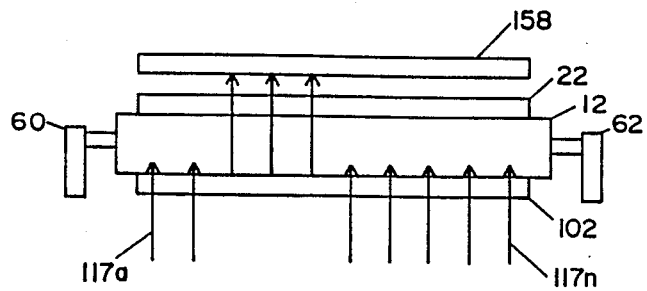

STEP 6
REMOVE BOTTOM PROTECT PLATE 160. SEPARATE UPPER AND LOWER PCB PATTERNS. APPLY UPPER PATTERN 102 TO BOTTOM OF LOADER BODY 12.

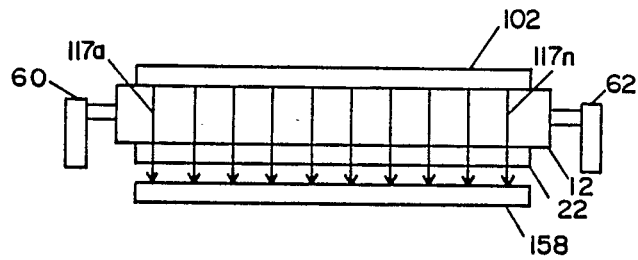

STEP 7
ROTATE ENTIRE UNIT ON PIVOTS 60 AND 62. THE PINS FALL BACK INTO LOADER BODY 12 BY GRAVITY WITH OR WITHOUT THE HELP OF VIBRATION OR LOCATION.

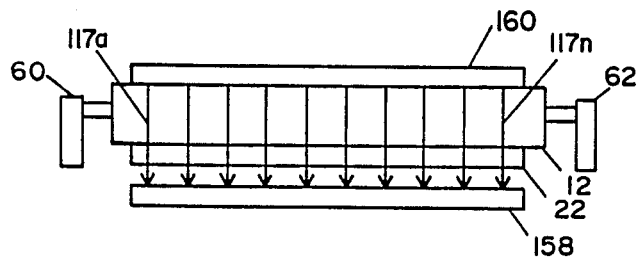

STEP 8
REMOVE UPPER PCB PATTERN 102. INSTALL LOWER PROTECT PLATE 160. LOADER BODY 12 IS NOW COMPLETELY FULL OF PINS AND READY TO LOAD DIFFERENT PCB PATTERNS, TO BE SHIPPED OR TO BE STORED.

FIG. 6

LOADING SYSTEM

BACKGROUND OF THE INVENTION

1. Field of the Invention

The present invention pertains to printed circuits, and more particularly, pertains to an indexing mechanism for a loading system for loading of test pins into a test fixture for testing of printed circuit boards.

2. Description of the Prior Art

The prior art test plates for testing of printed circuit boards have required manual or numerical control loading of test pins into fixtures, which has been a very time consuming manual or automated process requiring considerable dexterity or programming time. The number of hours required for loading of test pins into a test fixture has been forever-encompassing, requiring an excesive number of hours depending upon the complexity of the printed circuit board to be tested, usually requiring hours of man/woman labor for test pin loading. The state of the art has provided for robotic/numeric control loading of test pins, but this has always been cumbersome and manually performed or engineered by male or female labor, which has been labor intensive. Especially in the engineering programming areas.

The present invention overcomes the disadvantages of the prior art by providing a loading and unloading system incorporating gravity free fall of each of the test pins once a master pin grid array system has been preloaded, providing for subsequent loading and unloading of test plates for printed circuit boards.

SUMMARY OF THE INVENTION

The general purpose of the present invention is to provide a loading system which will load test pins as rapidly as gravity will provide that the test pins free fall from a master pin grid array sheet, also called the loading body, downwardly into a test fixture. A master pin grid, or loading body array system is preloaded with a plurality of test pins, such as 32,000, by way of example and for purposes of illustration only, and not to be limiting of the present invention, where the test fixture selectively receives a predetermined number of test pins as required for the testing of a particular printed circuit board design. After testing of each printed circuit board design, the test pins are reloaded back into the master pin grid array to their original locations leaving the pin array in a fully loaded and locked position by reversing the steps of the loading process.

According to one embodiment of the present invention, there is provided a loading system including a loader body with a plurality of holes, a sliding lock plate above and with offset capabilities with respect to the loader body including a plurality of holes, and at least two registration pins secured to the loader body. The registration pins accept a test body fixture including a like plurality of registration holes for registration pins, and elongated holes or other suitable registration structure provided in the sliding lock plate allow for movement of the sliding lock plate with respect to the loading body for either engaging the test pins or disengaging the test pins, and subsequently allowing for the test pins to be dropped when required through the sliding lock plate, through the loading body and then into the test fixture, also known as the test pattern. Loading of the test pins into the test fixture from the loading body is provided for by free fall gravity by the weight of the test pins falling through the loading body into the test fixture, whereby the head of the test pin engages over a smaller diameter hole to contain itself within the test fixture. The test pins can fall either through gravity or can be assisted by a vibrational or rotational movement of the loading body, especially for loading flexible test pins in off-grid (0.100 centers) test patterns. Likewise, the test pins can be reloaded from the test fixture back to the loading body in a like manner where the test plate is positioned below the loading body, and the loading body and associated members are inverted with gravity resulting in the test pins falling from the test plate back into the loading body where the sliding locking plate or protect plates can subsequently lock the test pins into the loading body in a reverse manner.

One significant aspect and feature of the present invention is a loading system which provides for repeatability on a timely basis for loading of test pins into a test plate, and likewise for the unloading of test pins from the test plate back into the loader body leaving the body in a completely full state of being loaded with pins.

Another significant aspect and feature of the present invention is that the pin loading system can be operated by non-technical personnel. The operation of the system is fully dependent upon gravity for loading and unloading of the test plate with test pins from and to the loader body.

An additional significant aspect and feature of the present invention is the flexibility of the test pin loading system in that different styles of test pins, including on-grid and off-grid printed circuit board patterns, can be utilized and loaded into the loading system.

Having thus described embodiments of the present invention, it is a principal object to provide a loading system for the loading of test pins into on-grid and off-grid test plates for the testing of printed circuit boards.

One object of the present invention is to provide a loading body with a pin grid array of test pins which can be subsequently loaded into and out of test patterns.

Another object of the present invention is to provide for gravity loading of test plates with test pins for testing printed circuit board in a testing machine.

A further object of the present invention is to provide for loading of flexible test pins, especially into off-grid (0.100 centers) boards.

An additional object of the present invention is the process for loading of either rigid or flexible test pins into a test pattern.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 3 illustrates a view taken along line 3—3 of FIG. 1 of an unlocked position for an on-grid test fixture;

FIG. 4A illustrates an unlocked position with a flexible test pin for an off-grid test fixture;

FIG. 4B illustrates an unlocked position for an off-grid test fixture with an upper test pattern being vibrated or rotated with respect to a lower test pattern;

FIG. 5 illustrates a flow chart and graphical representation of a loading process; and FIG. 6 illustrates a flow chart and graphical representation of an unloading process.

DESCRIPTION OF THE PREFERRED EMBODIMENTS

Figure 1:
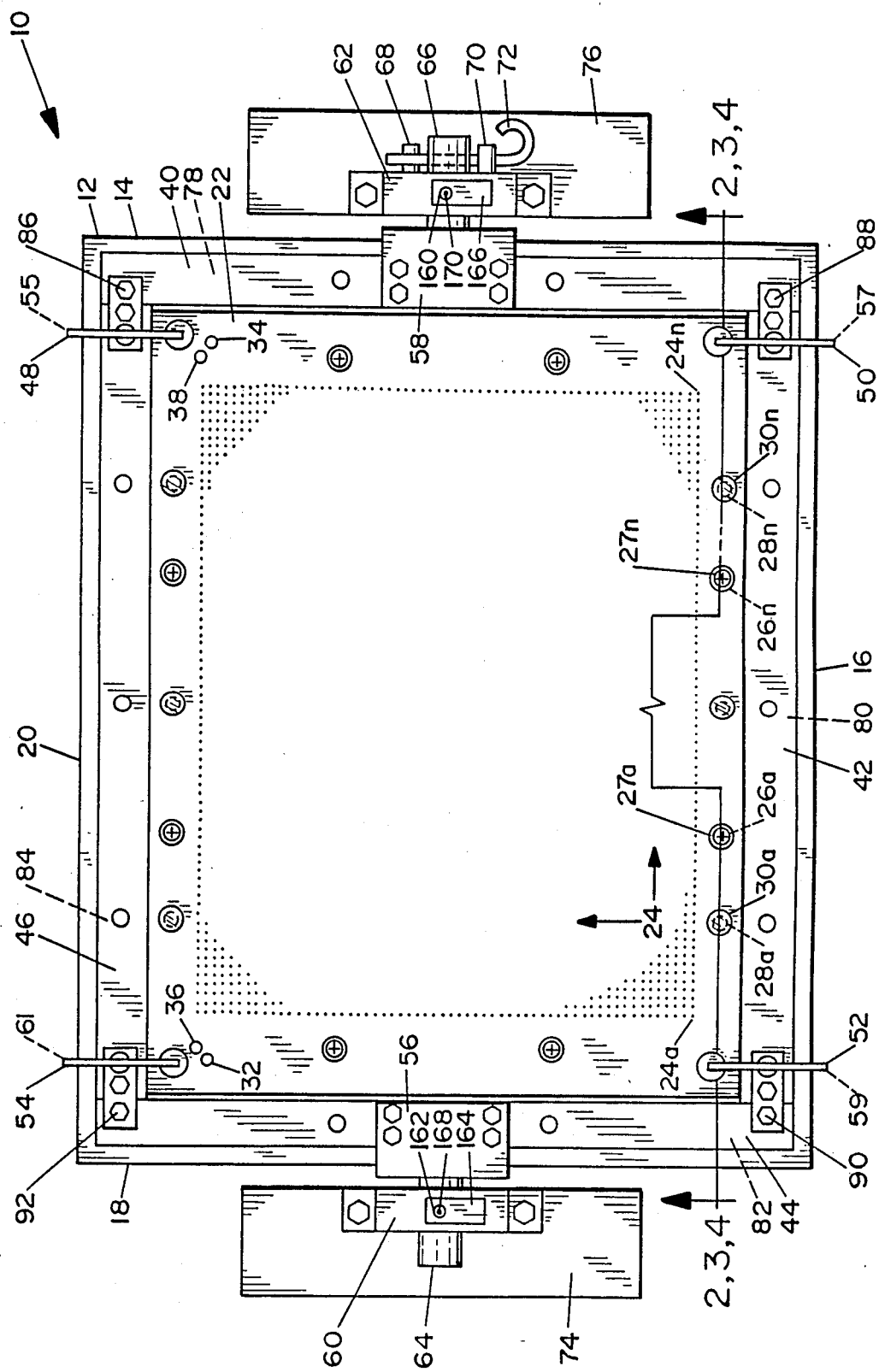
FIG. 1 illustrates a plan view of a pin loading system.
Figure 2:
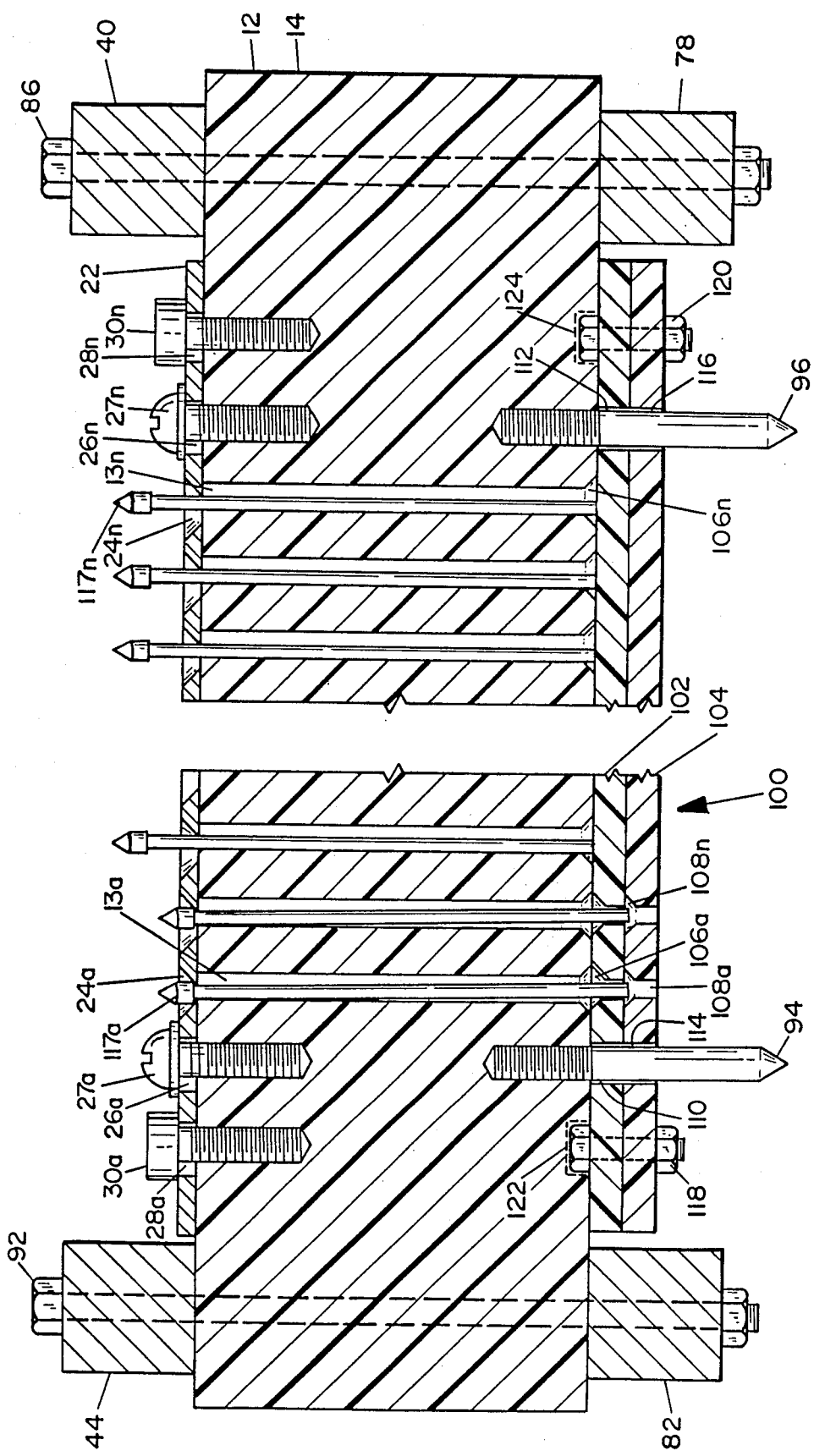
FIG. 2 illustrates a view taken along line 2—2 of FIG. 1 of the pin loading system in a locked position for an on-grid test fixture.

FIG. 1 illustrates a pin loading system 10, the present invention, including a pin grid array loading body 12 in the form of a plate with sides 14, 16, 18, and 20, and an array of holes 13a–13n on FIG. 2. A sliding lock plate or protect plate 22 positions over the loader body 12. Sliding lock plate 22 includes a plurality of countersunk holes 24a–24n countersunk in either or both sides which correspond in geometry to test pin holes 13a–13n in the loader body. Countersunk holes help provide for alignment of each test pin. The holes help provide for alignment of each test pin. The holes can number in terms of 10,000–40,000 by way of example and for purposes of illustration only. Elongated or larger diameter sliding holes 26a–26n in FIG. 2 provide for movement about the head of washered screws or other securing devices 27a–27n. Elongated holes or other suitable registration structure 28a–28n provide for movement stoppage at correct concentric locations to loader body holes about the shouldered guide dowels 30a–30n. Alignment dowels 32, 34, 36 and 38 provide for alignment of the printed circuit board test plates 102 and 104 of FIG. 2 to the loader body 12. Upper rails 40, 42, 44 and 46 provide for reinforcement of the loader body 12. Upper clamps 48, 50, 52 and 54 provide for clamping of members 12 and 22. Likewise, bottom clamps 55, 57, 59, 60 provide for clamping of the printed circuit test plates to the underside of the loading body 12. The clamps are also used to position protection plates, as discussed later, upon the upper and lower surfaces of the loading body 12 to preclude inadvertent test pin fallout and also act as shipping and storing test pin containment member.

Mounting brackets 56 and 58 support the loader body 12, and all associated structure for pivotable movement about a 180° axis about the pivot rods 64 and 66 in pivot housings 60 and 62. Stops 68 and 70 are provided for limiting rotation about a 180° axis and are controlled by stop key 72 or other suitable structure acting against the stops 68 and 70. Mounting plates 74 and 76 provide for mounting such as on a test bench or the like. Lower alignment rails 78, 80, 82 and 84 provide for reinforcement of loader body 12. Representative bolts 86, 88, 90 and 92 provide for bolting the entire pin loading system together.

Removable indexing dowels 94 and 96 of FIG. 2 provide for indexing of the printed circuit board test patterns to the pin loading system. The indexing dowels 94 and 96 cooperate with alignment dowels 32–38. The indexing dowels 94 and 96 are the geometrical members which align the test board patterns with respect to the pin loading body providing for accurate gravity flow of the test pins into the test patterns from the pin loading body or from the test patterns back into the pin loader body.

FIG. 2 illustrates a view taken along line 2—2 of FIG. 1 where all numerals correspond to those elements previously described. Particularly illustrated is a test pattern 100 including an upper plate 102 and a lower plate 104. The upper plate 102 includes a plurality of holes 106a–106n and the lower plate 104 includes a plurality of holes 108a–108n, the holes in the upper plate and the lower plate being geometrically identical as to location. The body of holes 106a–106n and holes 108a–108n are smaller in diameter than that of holes 13a–13n and the diameter of each of the test pin heads 117a–117n. Each hole includes a countersunk edge providing for alignment and gravity free fall of the test pins 117a–117n. Alignment holes 110 and 112 in the top plate, and 114 and 116 in the bottom plate provide for alignment of the plates 102 and 104 with respect to the loading body 12 utilizing indexing dowels 94 and 96. Also, the top and bottom plates are bolted together with nut-and-bolt assemblies 118 and 120 which is optional. The bolt head fits into a recess 122 and 124 of the loading body, as illustrated in the figure which is optional.

MODE OF OPERATION

FIG. 3 illustrates the operation of the pin loading system 10 of FIG. 1 and the sliding locking plate aligned with the pin loading plate so as to provide for passage of test pins down into the test pattern 100, as illustrated on the left-hand side of the figure. When there are no corresponding holes in the test pattern, the test pins stay positioned in the loading body as illustrated by pins 117c–117n in FIG. 3. After the test pattern has been loaded, the sliding locking plate 22 is again pushed over a finite distance to engage and lock the head of the test pins remaining within the loading body in the sliding locking plate due to the reduced cross-sectional area of the resulting holes between the sliding locking plate 22 and the loading body 12. The reduction in the hole area between the sliding locking plate 22 and the loading body 12 at the interface between the two plates provides for the locking of the test pins 117 during a loading procedure or an unloading procedure. Removal of the protect plate and replacing it with the test patterns 100 with the 180° rotation will also lock the patterns. Clamps 55–61 of FIG. 1 secure the test patterns to the underside of the loading body 12 pushing the unused test pins 117c–117n slightly upwardly within the loading body 12 while allowing gravity to cause the test pins to be positioned to fall into the test fixture 100 during a loading procedure. The body of holes 106a–106n and 108a–108n are smaller in diameter than the test pin head causing the test pin to rest with its head engaged over and above holes 106a–106n when released from the loading body 12 and locking plate 22.

FIGS. 4A and 4B illustrates the loading of pins into a test pattern structure which is off-grid; that is, where the holes in the test fixture are not centered and geometrically aligned with respect to the loader body, nor are the holes of test fixture 126 necessarily aligned with the holes of lower test fixture 128. By separating the upper test pattern plate 126 with respect to the lower test pattern plate 128, and including alternative registration dowels 130 and 132 with sections of reduced diameter 134 and 136, respectively, the top plate 126 can be reciprocated manually or vibrated by a motor 138 and cam assembly 140 for random sampling and movement for alignment of the top plate 126 to coincide with the holes of the loader body for subsequent loading of the test pattern with loading flexible shaft test pins 142a–142n. Such an example is the bending shaft of the flexible test pin 142n during the camming movement of the top plate 126 with respect to the bottom plate 128 of the test pattern, providing for loading of the test pattern with a flexible test pin which is off-grid. Optional screw fasteners 142 and 144 secure upper and lower test pattern plates 126 and 128 together in a free-floating fashion in conjunction with spacers 150 and 152. Optional screw fasteners 146 and 148 whose heads ride within oversize countersunk holes 154 and 156 in test pattern plate 126. The surface area of the holes is varied by the cam movement which can be circular, oval, or any other geometrical movement.

When drilling the bottom plate 128, a piece of mylar indexer or compatible type of material can also be drilled with the same pattern as plate 128. This can be attached above plate 126 onto loader body. The holes of the material will also be identical with plate 128 and loader body hole locations. The indexer will then allow pins to go back only to the holes from where the pins came from in loader body.

Solid, rigid, or flexible test pins can be used. The test pins can also be a mix of solid and flexible as required of course being dependent on the centering of the holes.

Tapped holes 160 and 162 can be provided in FIG. 1 for securing of rectangular flange tabs for preventing rotation. The flanges 164 and 166 can be loosened for rotation by pivoting about screws 168 and 170, and tightened to prevent rotation. This option can also be utilized instead of stop pins 68 and 70 or a key lock pin 72.

FIG. 5 illustrates a flow chart and graphical representation of the loading process. The loader body is preloaded entirely with test pins and then provided with protecting plates held by the clamps on the top and bottom so that the test pins cannot accidentally fall out. Next, the top and bottom protecting plates are removed once the locking plate 158 and 160 is in the locked position. Then, a test pattern is aligned with the registration dowels and held by the clamps. The sliding lock plate is moved, allowing for the test pins to fall selectively into the test pattern by gravity feed. Any test pins which have not fallen by gravity feed are then held by movement of the sliding lock plate back into a test pin engagement position. The test pattern is then removed for use and again the top and bottom soft polycarbonate plastic protecting plates or like material 158 and 160 are reapplied to the loader body. Likewise, upper and lower protecting plates 158 and 160 can be applied to the top and bottom of the test board in the event the test board has to be placed in storage or shipped. The plates are soft polycarbonate or like material so as to protect the tips of the test pins. Clamps are applied or removed appropriately during the loading and unloading process.

FIG. 6 illustrates unloading of the test fixture which is in the reverse of the loading procedure of the test pattern. The bottom protect plate is removed and the upper and lower test patterns are separated. The upper test pattern is registered to the bottom of the loader body through the indexing pins. Locking plate is unlocked at this point. Then, the entire assembly is rotated as a unit so the pins fall by gravity into the loader body. Finally, the upper test pattern is removed, locking plate locked, and the lower protect plate is installed and the loading body is again completely loaded with test pins and ready after rotating the loading body to the upright position again to load any other test patterns as required.

The test pins can also be retained and released from loader body by the use of the two protect plates clamped in place, and removed depending on a load or unload operation. This applies to flip-flop option of the system. By reversing the loading operation, patterns are reattached to the loader after removal of bottom protect plate while locking plate is locked. When the top protect plate is in position, the locking plate is unlocked, the loader is rotated, and the test pins drop back into the body from where the pump was originally located. A non-rotating fixture model also can be used where the only difference is that the machine does not move until the locking plate moves with or without attachment of the pattern plates.

It is claimed:
1. Loading system comprising:
  a. a plurality of test pins;
  b. test pin loading body having a thickness equal to at least 50% of the length of said pins and a plurality of holes arranged in a grid array for supporting said test pins;
  c. lock plate including a like plurality of holes and positioned over said loading body;
  d. said lock plate movable between a locked position holding said pins in said loading body and an unlocked position allowing said pins to fall from said loading body;
  e. test pattern means including an upper test pattern plate having holes therein corresponding to those of said test pins to be used in a test and a lower test pattern plate having holes therein corresponding to contact points on a circuit to be tested;
  f. registration dowels for registering said test pattern means to said loading body for selective loading of said test pins from said loading body to said test pattern means in accordance with the holes in said lower test pattern plate when said lock plate is moved from said locked position to said unlocked position providing for gravity fall of said test pins from said loading body into said test pattern means.
2. System of claim 1 wherein each of said test pins are rigid.
3. System of claim 1 wherein each of said test pins are flexible.
4. System of claim 1 wherein said pins are solid and flexible.
5. System of claim 1 including means for rotating said test pattern.
6. System of claim 1 including means for vibrating said test pattern.
7. System of claim 1 including at least one protect plate means about said loading plate during storage, loading, or unloading.

* * * * *